(12) United States Patent
Nii

(10) Patent No.: US 6,868,001 B2
(45) Date of Patent: Mar. 15, 2005

(54) SEMICONDUCTOR MEMORY DEVICE

(75) Inventor: Koji Nii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/211,350

(22) Filed: Aug. 5, 2002

(65) Prior Publication Data

US 2003/0034571 A1 Feb. 20, 2003

(30) Foreign Application Priority Data

Aug. 16, 2001 (JP) ........................................ 2001-247303

(51) Int. Cl.$^7$ .............................................. G11C 11/00
(52) U.S. Cl. .................. 365/156; 365/230.05; 365/514; 365/516; 257/200; 257/321; 257/369
(58) Field of Search ................................. 365/154, 156, 365/230.05, 514, 516; 257/200, 321, 369

(56) References Cited

U.S. PATENT DOCUMENTS 5,049,967 A * 9/1991 Watanabe et al. ........... 257/370
6,590,802 B2 * 7/2003 Nii ............................... 365/156
2002/0181273 A1 * 12/2002 Nii et al. ..................... 365/154

FOREIGN PATENT DOCUMENTS

| JP | 10-178100 | | 6/1998 | |
| JP | 11-135647 | * | 5/1999 | ....... H01L/21/8244 |
| JP | 2000-36543 | | 2/2000 | |
| JP | 2000-036543 | * | 2/2000 | ....... H01L/21/8244 |
| JP | 2001-28401 | | 1/2001 | |

* cited by examiner

Primary Examiner—Hoai Ho
Assistant Examiner—Dao H. Nguyen
(74) Attorney, Agent, or Firm—Burns, Doane, Swecker & Mathis, L.L.P.

(57) ABSTRACT

With a P well region being divided, NMOS transistors N1 and N3 are formed in the first P well region, and NMOS transistors N2 and N4 in the second P well region. Alternatively, with a N well region being divided, PMOS transistor P1 is formed in the first N well region, and PMOS transistor P2 in the second N well region.

16 Claims, 9 Drawing Sheets

- ▨ DIFFUSED LAYER
- ▨ POLYSILICON LAYER
- ▨ CONTACT HOLE
- ▨ FIRST METAL WIRING
- ⊠ FIRST VIA HOLE
- ▭ SECOND METAL WIRING

SEMICONDUCTOR MEMORY DEVICE

BACKGROUND OF THE INVENTION

1. Field of the Invention

The present invention relates to a semiconductor memory device constituting the memory cell of a CMOS static RAM.

2. Description of Related Art

FIG. 9 is a layout configuration diagram showing a conventional semiconductor memory device.

Referring to FIG. 9, reference numeral 1 denotes an one-bit SRAM, reference numerals N1, N2, N3, and N4 denote NMOS transistors formed in a P well region, and reference numerals P1 and P2 denote PMOS transistors formed in a N well region. The NMOS transistor N1 and PMOS transistor P1 make up a first inverter, and the NMOS transistor N2 and PMOS transistor P2 make up a second inverter.

Reference numeral a1 denotes a first metal wiring a1 which connects the drain of NMOS transistor N1 with that of PMOS transistor P1, reference numeral a2 denotes a second metal wiring which connects the output terminal of the first inverter with the input terminal of the second inverter, and the first metal wiring a1 and second metal wiring a2 make up a memory node. Reference numeral b1 denotes a first metal wiring b1 which connects the drain of NMOS transistor N2 with that of PMOS transistor P2, reference numeral b2 denotes a second metal wiring which connects the output terminal of the second inverter with the input terminal of the first inverter, and the first metal wiring b1 and second metal wiring b2 make up a memory node.

Reference numeral C denotes a diffusion contact hole, reference numeral GC denotes a gate contact hole, reference numeral VDD denotes the power supply potential of a P+ diffused region formed in the N well region, reference numeral GND denotes the ground potential of a N+ diffused region formed in the P well region, reference numeral WL1 denotes a word line connected with the gate of the NMOS transistor N3, reference numeral WL2 denotes a word line connected with the gate of the NMOS transistor N4, reference numeral BL1 denotes a bit line connected with the drain of the NMOS transistor N3, and reference numeral BL2 denotes a bit line connected with the drain of the NMOS transistor N4.

The operation will next be described.

When parts are laid out as shown in FIG. 9, a SRAM can be formed into the circuit configuration shown in FIG. 2.

When a semiconductor memory device as shown in FIG. 9 is formed, for instance, the NMOS transistors N1, N2, N3, and N4, the PMOS transistors P1 and P2, the first metal wirings a1 and b1, and the word lines WL1 and WL2 are formed in the first layer. The second metal wirings b1 and b2 are formed in the second layer, and the bit lines BL1 and BL2 are formed in the third layer.

Such an arrangement of the conventional semiconductor memory device as mentioned above contributes to enhancement of the integration degree of the SRAM. However, this arrangement requires the second metal wirings a2 and b2 to be wired in a layer different from the first metal wirings a1 and b1. For this reason, in proportion to the increase in the number of the wiring layers, manufacturing processes increase. As a result, this brings about long manufacturing terms and high manufacturing costs.

In addition to the above-described prior art, JP-A-28401/2001 discloses a technology in which the second metal wirings a2 and b2 are wired in the same layer as the first metal wirings a1 and b1 by dividing the P well region. However, in this case, because one word line is shared, the word line must be wired in a different layer.

SUMMARY OF THE INVENTION

The present invention has been made to solve the above-mentioned problems, and an object of thereof is to provide a semiconductor memory device in which high integration degree can be achieved by use of a small number of wiring layers.

In the semiconductor memory device according to the present invention a first PMOS transistor and a second PMOS transistor are formed in a N well region, a first NMOS transistor and a third NMOS transistor are formed in a first P well region, and a second NMOS transistor and a fourth NMOS transistor are formed in a second P well region, and a first word line is wired to the third NMOS transistor and a second word line is wired to the fourth NMOS transistor.

According to the present invention, since the semiconductor memory device is arranged such that the first PMOS transistor and the second PMOS transistor are formed in a N well region, the first NMOS transistor and the third NMOS transistor are formed in a first P well region, and the second NMOS transistor and the fourth NMOS transistor are formed in a second P well region, and that a first word line is wired to the third NMOS transistor, and a second word line is wired to the fourth NMOS transistor, high integration degree can be achieved by use of a small number of wiring layers.

In the semiconductor memory device according to the present invention the first to the fourth NMOS transistors are formed in a P well region, the first PMOS transistor is formed in a first N well region, and the second PMOS transistor is formed in a second N well region, and a first word line is wired to the third NMOS transistor and a second word line is wired to the fourth NMOS transistor.

According to the present invention, since the first to the fourth NMOS transistors are formed in a P well region, the first PMOS transistor is formed in a first N well region, and the second PMOS transistor is formed in a second N well region, and since a first word line is wired to the third NMOS transistor and a second word line is wired to the fourth NMOS transistor, high integration degree can be achieved by use of a small number of wiring layers.

DETAILED DESCRIPTION OF THE PREFERRED EMBODIMENTS

The embodiments of the present invention will next be described in detail with reference to the attached drawings.

First Embodiment

Figure 1:
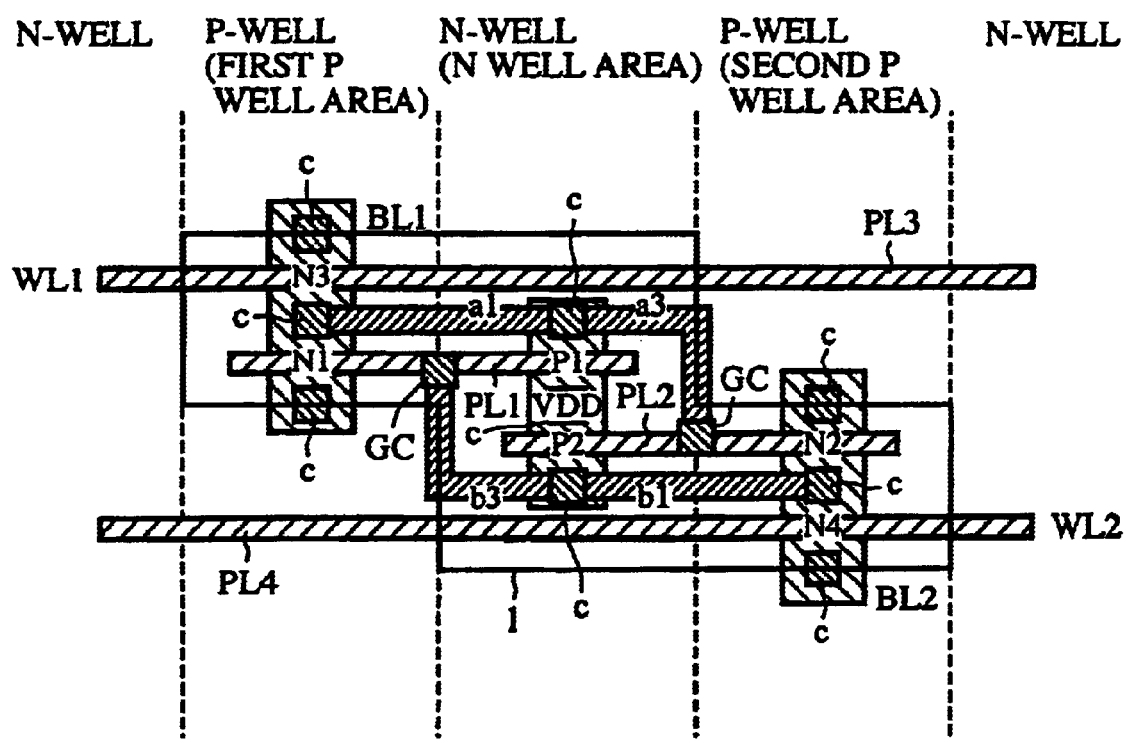
FIG. 1 is a layout configuration diagram showing a semiconductor memory device according to a first embodiment of the present invention.
Figure 2:
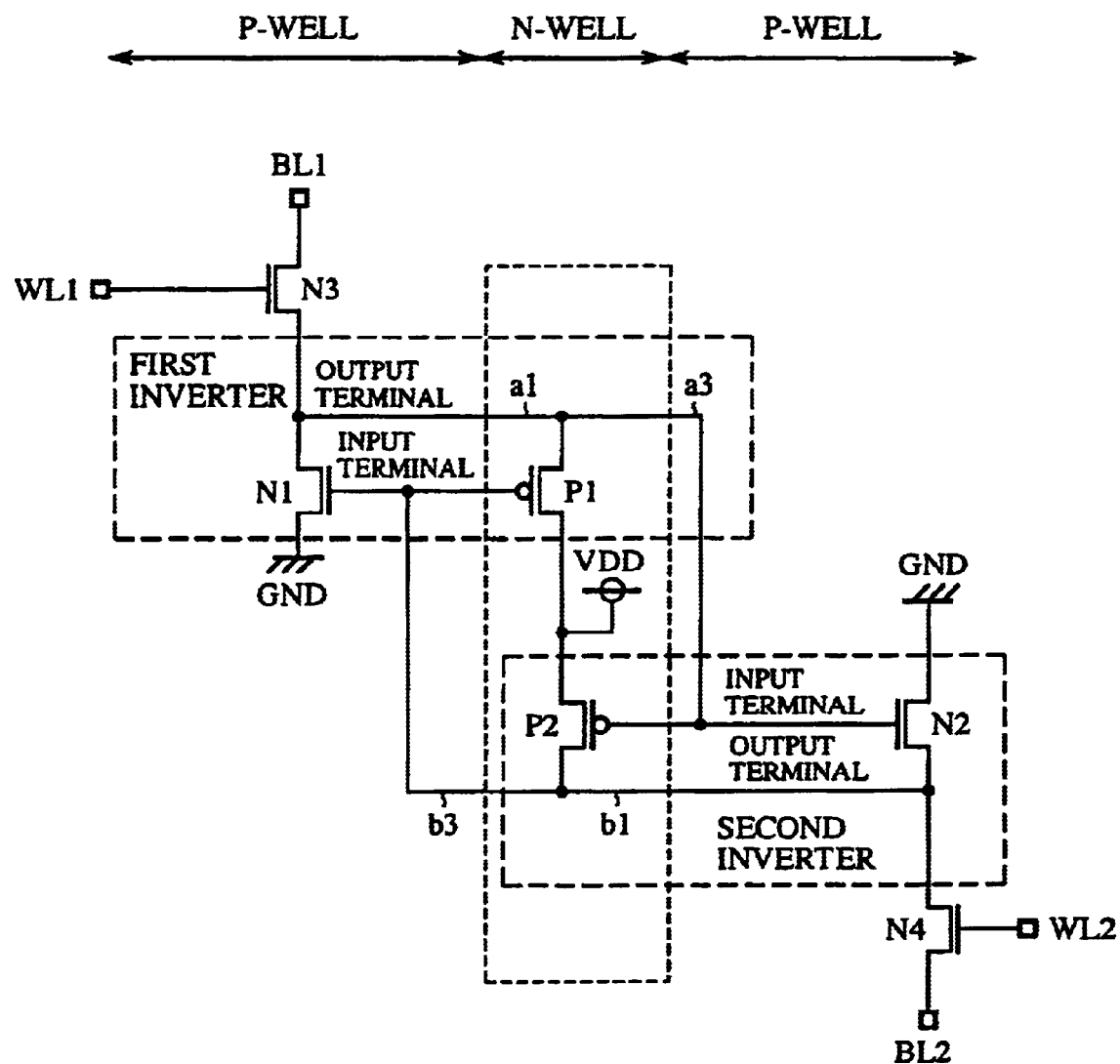
FIG. 2 is a circuit diagram showing the semiconductor memory device shown in FIG. 1.

FIG. 1 is a layout configuration diagram showing a semiconductor memory device according to the first embodiment of the present invention. FIG. 2 is a circuit diagram showing the semiconductor memory device shown in FIG. 1.

Referring to FIGS. 1 and 2, reference numeral 1 denotes an one-bit SRAM, reference numeral N1 denotes an NMOS transistor (a first NMOS transistor) formed in a first P well region, reference numeral N2 denotes an NMOS transistor (a second NMOS transistor) formed in a second P well region, reference numeral N3 denotes an NMOS transistor (a third NMOS transistor) formed in the first P well region. Reference numeral N4 denotes an NMOS transistor (a fourth NMOS transistor) formed in the second P well region. Reference numeral P1 denotes a PMOS transistor (a first PMOS transistor) formed in a N well region, and reference numeral P2 denotes a PMOS transistor (a second PMOS transistor) formed in the N well region. The NMOS transistor N1 and PMOS transistor P1 make up a first inverter, and the NMOS transistor N2 and PMOS transistor P2 a second inverter.

Reference numeral a1 denotes a first metal wiring which connects the drain of the NMOS transistor N1 with the drain of the PMOS transistor P1, reference numeral a3 denotes a first metal wiring which connects the output terminal of the first inverter with the input terminal of the second inverter, and the first metal wirings a1 and a3 make up a memory node. Reference numeral b1 denotes a first metal wiring which connects the drain of the NMOS transistor N2 with the drain of the PMOS transistor P2, reference numeral b3 denotes a first metal wiring which connects the output terminal of the second inverter with the input terminal of the first inverter, and the first metal wirings b1 and b3 make up a memory node.

Reference numeral C denotes a diffusion contact hole, reference numeral GC denotes a gate contact hole, reference numeral VDD denotes the power supply potential of a P+ diffused region formed in the N well region, and reference numeral GND denotes the grand potential of a N+ diffused region formed in the P well region. Reference numeral WL1 denotes a word line (a first word line) connected with the gate of NMOS transistor N3. Reference numeral WL2 denotes a word line (a second word line) connected with the gate of the NMOS transistor N4. Reference numeral BL1 denotes a bit line connected with the drain of the NMOS transistor N3, reference numeral BL2 denotes a bit line connected with the drain of the NMOS transistor N4. Reference numeral PL1 denotes a polysilicon wiring which connects the gate of the PMOS transistor P1 with the gate of the NMOS transistor N1, reference numeral PL2 denotes a polysilicon wiring which connects the gate of the PMOS transistor P2 with the gate of NMOS transistor N2, a polysilicon wiring PL3 makes up the word line WL1, and a polysilicon wiring PL4 makes up the word line WL2.

The operation will next be described.

FIG. 1 shows layers extending from the well to the first metal wirings, in which one N-type well region and two P-type well regions are formed. The first and the second P well regions and the N well region are formed in a direction orthogonal to the word lines WL1 and WL2 in a strip-of-paper shape.

The PMOS transistors P1 and P2 are formed in one N well region, the NMOS transistors N1 and N3 in the first P well region, and the NMOS transistors N2 and N4 in the second P well region.

In FIG. 1, the parts in which the diffused layer and the polysilicon layer being overlapped each other will be transistors. The gate of the PMOS transistor P1 and the gate of the NMOS transistor N1 are connected each other through the polysilicon wiring PL1, and the polysilicon wiring PL1 is connected with the first metal wiring b3 constituting a memory node. In a similar manner, the gate of the PMOS transistor P2 and the gate of the NMOS transistor N2 are connected each other through the polysilicon wiring PL2, and the polysilicon wiring PL2 is connected with the first metal wiring a3 constituting a memory node.

A P+ diffused region is formed by injecting a P-type impurity in the N well region, and a N+ diffused region is formed by injecting an N-type impurity in the P well region. In each of the diffused regions, at least one or more diffusion contact holes C are formed, and the diffused region is connected with the first metal wirings a1, a3, b1, and b3 through the diffusion contact hole C.

The N+ diffused region located in the center of the first P well region and the P+ diffused region located in the upper of the N well region are electrically connected through the diffusion contact hole C and the first metal wiring a1 at low impedance. They are further electrically connected with the polysilicon wiring PL2 through the first metal wiring a3 and the gate contact hole GC at low impedance. This part makes up one memory node (the first metal wirings a1 and a3) of the SRAM 1.

The N+ diffused region located in the center of the second P well region and the P+ diffused region located in the lower of the N well region are electrically connected through the diffusion contact hole C and the first metal wiring b1 at low impedance. They are further electrically connected with the polysilicon wiring PL1 through the first metal wiring b3 and the gate contact hole GC at low impedance. This part makes up the other memory node (the first metal wirings b1 and b3) of the SRAM 1.

The P+ diffused region located in the center of the N well region is connected with the VDD potential wired through the second metal wiring through the diffusion contact hole C and the like. In FIG. 1, in order to clarify, the first and the second metal wirings are omitted, which corresponds to the sources of the PMOS transistors P1 and P2 in the circuit diagram of FIG. 2.

The N+ diffused region located in the lower of the first P well region and the N+ diffused region located in the upper of the second P well region each are connected with the GND potential wired with the second metal wiring through the diffusion contact holes C. In FIG. 1, in order to clarify, the first and the second metal wirings are omitted, which corresponds to the sources of the NMOS transistors N1 and N2 in the circuit diagram of FIG. 2.

The N+ diffused region located in the upper of the first P well region and the N+ diffused region located in the lower of the second P well region each are connected with the bit lines BL1 and BL2 wired with the second metal wiring through the diffusion contact holes C.

The polysilicon wirings PL3 and PL4 are elongated and wired in a horizontal direction to form the word lines WL1 and WL2.

As is apparent from the above description, according to the first embodiment, the NMOS transistors N1 and N3 are formed in the first P well region, and the NMOS transistors N2 and N4 are formed in the second P well region, to enable the efficient wiring of the first metal wirings a3 and b3 connecting each of the memory nodes mutually, without overlapping the metal wires. Accordingly, the first metal wirings a3, b3 and the first metal wirings a1, b1 can be wired in the same wiring layer. This reduces the number of wiring layers of the semiconductor memory device.

Moreover, the polysilicon wirings PL1, PL2, PL3, and PL4 are placed in the same direction. This not only facilitates the adjustment of the gate size but also removes a wasted region, resulting in reduction in the region of the semiconductor device.

As is apparent from FIG. 1, the PMOS transistors P1 and P2 are formed such that the source and the drain align in a direction orthogonal to the word lines WL1 and WL2.

Further, the NMOS transistors N1 and N3 are formed such that the source and the drain align in a direction orthogonal to the word line WL1.

In addition, the NMOS transistors N2 and N4 are formed such that the source and the drain align in a direction orthogonal to the word line WL2.

This narrows the widths of the P and the N well regions.

Second Embodiment

Figure 3:
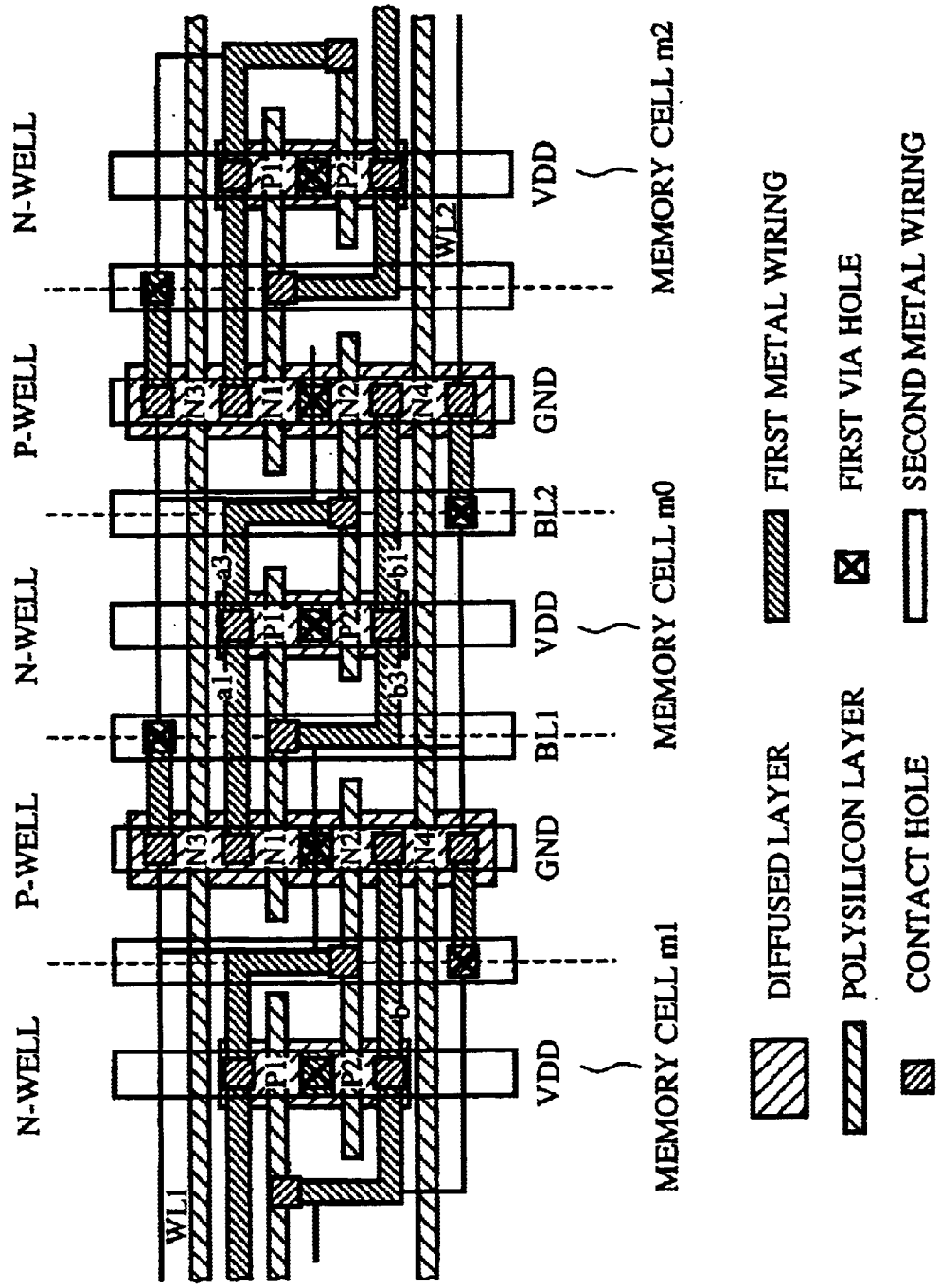
FIG. 3 is a layout configuration diagram showing a semiconductor memory device according to a second embodiment of the present invention.
Figure 4:
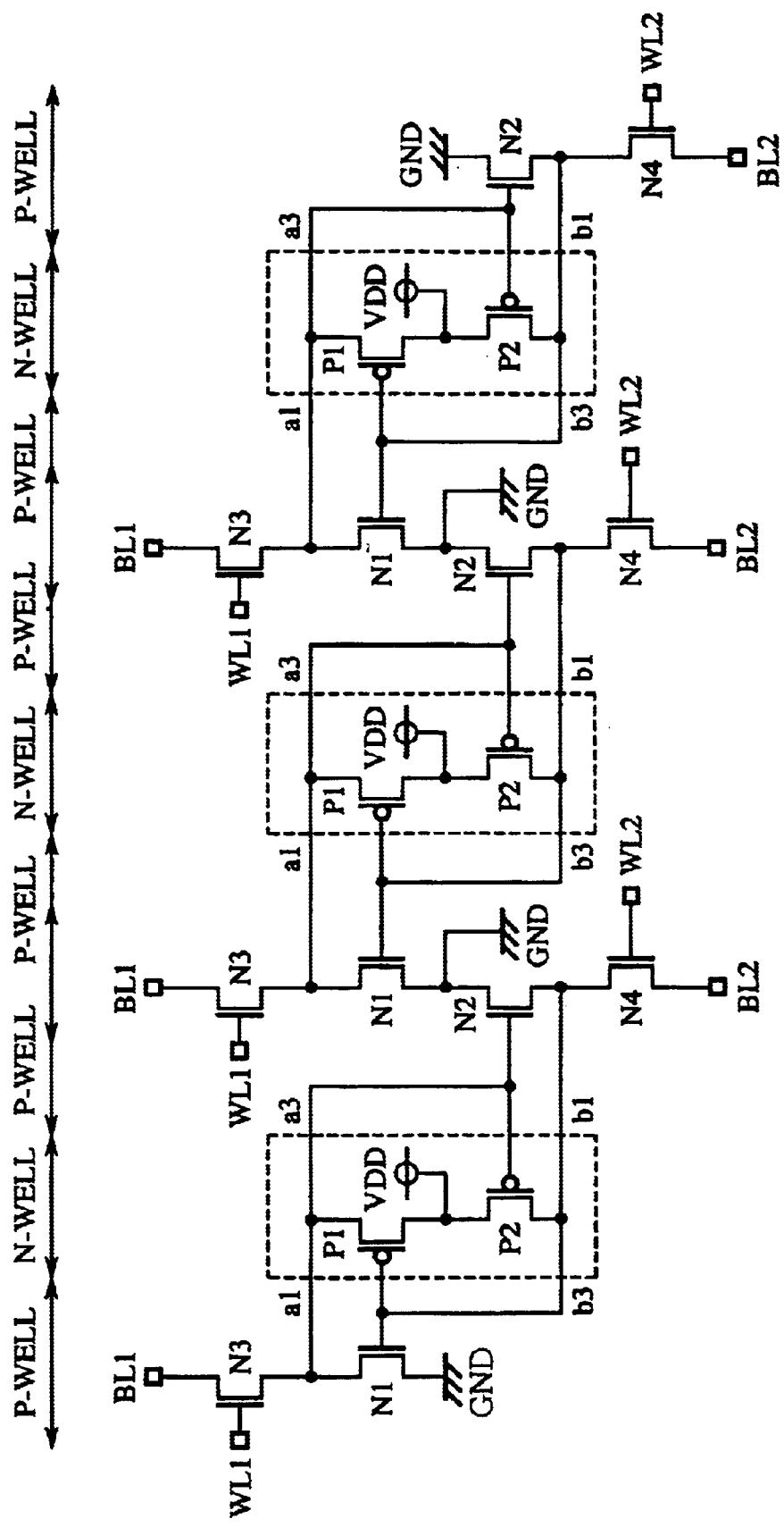
FIG. 4 is a circuit diagram showing the semiconductor memory device shown in FIG. 3.

In the first embodiment, the semiconductor memory device made up of the one-bit SRAM is shown. In the case where the semiconductor memory device is a plural-bits SRAM, the semiconductor memory device should be formed into the layout configuration such as shown in FIG. 3. FIG. 4 is a circuit diagram showing the semiconductor memory device shown in FIG. 3.

In the second embodiment, the source of the NMOS transistor N2 of a memory cell m1 is connected to the N+ diffused region (corresponding to the N+ diffused region located in the lower of the first P well region in FIG. 1) to which the source of the NMOS transistor N1 of a memory cell m0 is connected to share the N+ diffused region.

Similarly, the source of the NMOS transistor N1 of a memory cell m2 is connected to the N+ diffused region (corresponding to the N+ diffused region located in the upper of the second P well region in FIG. 1) to which the source of the NMOS transistor N2 of the memory cell m0 is connected to share the N+ diffused region.

When such layout configuration is taken, a plurality of memory cells can be fitted together like jigsaws. This removes a wasted region and reduces the region of the semiconductor device.

The bit lines BL1 and BL2 connected with the drains of the NMOS transistors N3 and N4 in each of memory cells are wired such that a power line or a ground line is placed between the bit lines as shown in FIG. 3, without adjoining to each other on the second layer.

This shields the bit lines by the VDD potential or the GND potential, and therefore suppresses interference between the bit lines caused by cross talk and the like.

Third Embodiment

Figure 5:
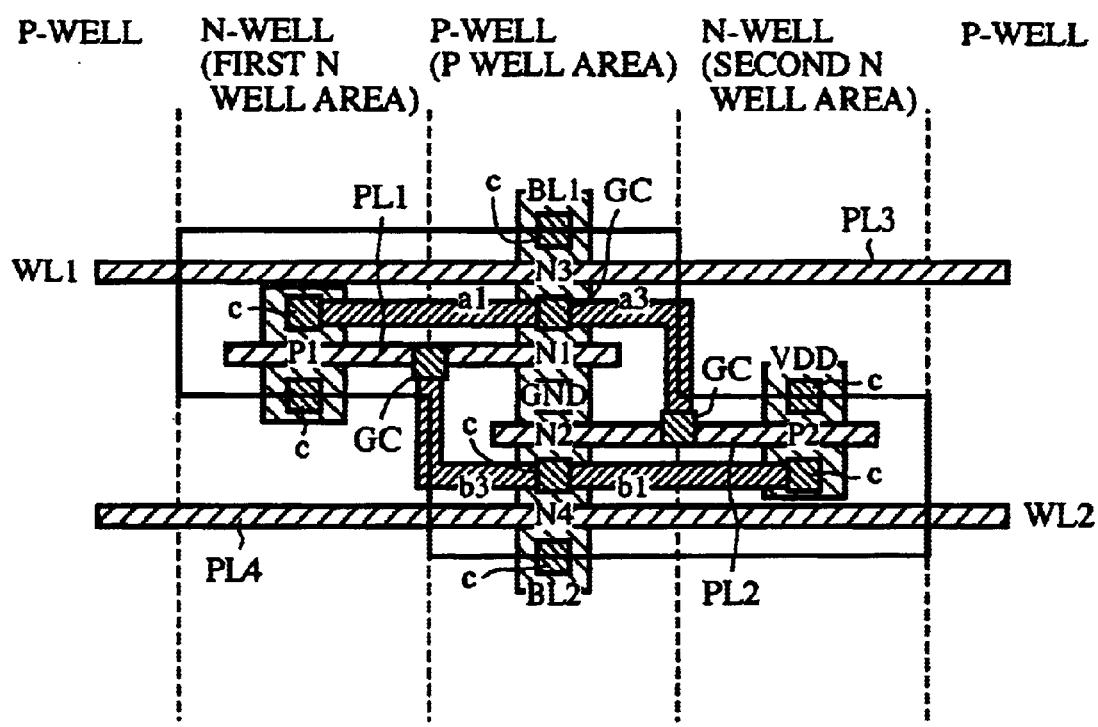
FIG. 5 is a layout configuration diagram showing a semiconductor memory device according to a third embodiment of the present invention.
Figure 6:
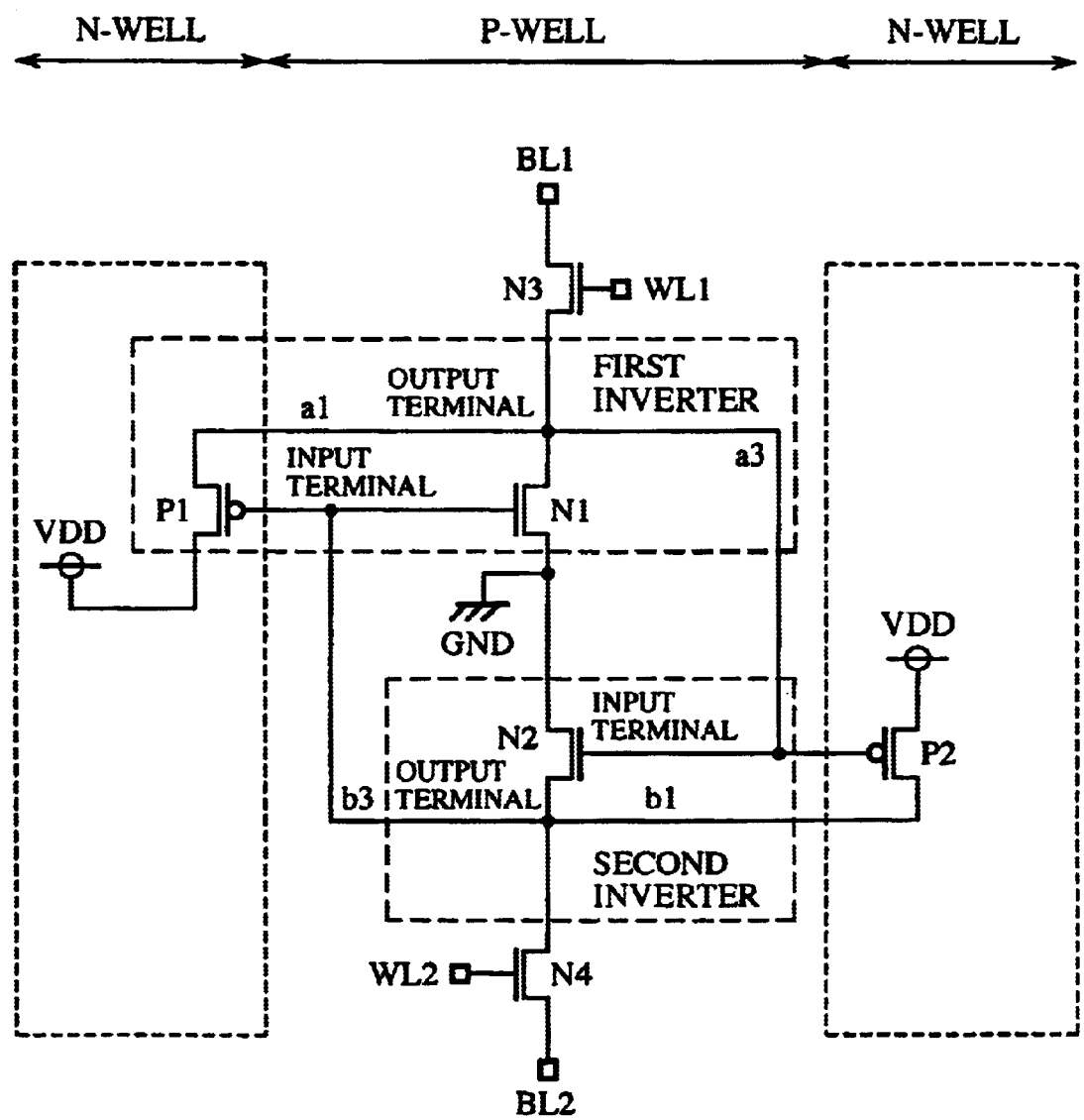
FIG. 6 is a circuit diagram showing the semiconductor memory device shown in FIG. 5.

While in the first embodiment, the NMOS transistors N1 and N3 are formed in the first P well region, and the NMOS transistors N2 and N4 are formed in the second P well region by dividing a P well region, the PMOS transistor P1 may be formed in the first N well region, and PMOS transistor P2 may be formed in the second N well region by dividing a N well region as in FIGS. 5 and 6. In this event, the same effect as the first embodiment can be obtained.

The arrangement of the other parts can be easily inferred from the description in the first embodiment, so more detailed description thereof is omitted. The NMOS transistors N1, N2, N3, and N4 are formed in a P well region. At that time, the NMOS transistors N1, N2, N3, and N4 are formed such that the sources and drains thereof align in a direction orthogonal to the word lines WL1 and WL2.

The sources of NMOS transistors N1 and N2 are connected with the ground potential of a N+ diffused region formed in P well region.

Fourth Embodiment

Figure 7:
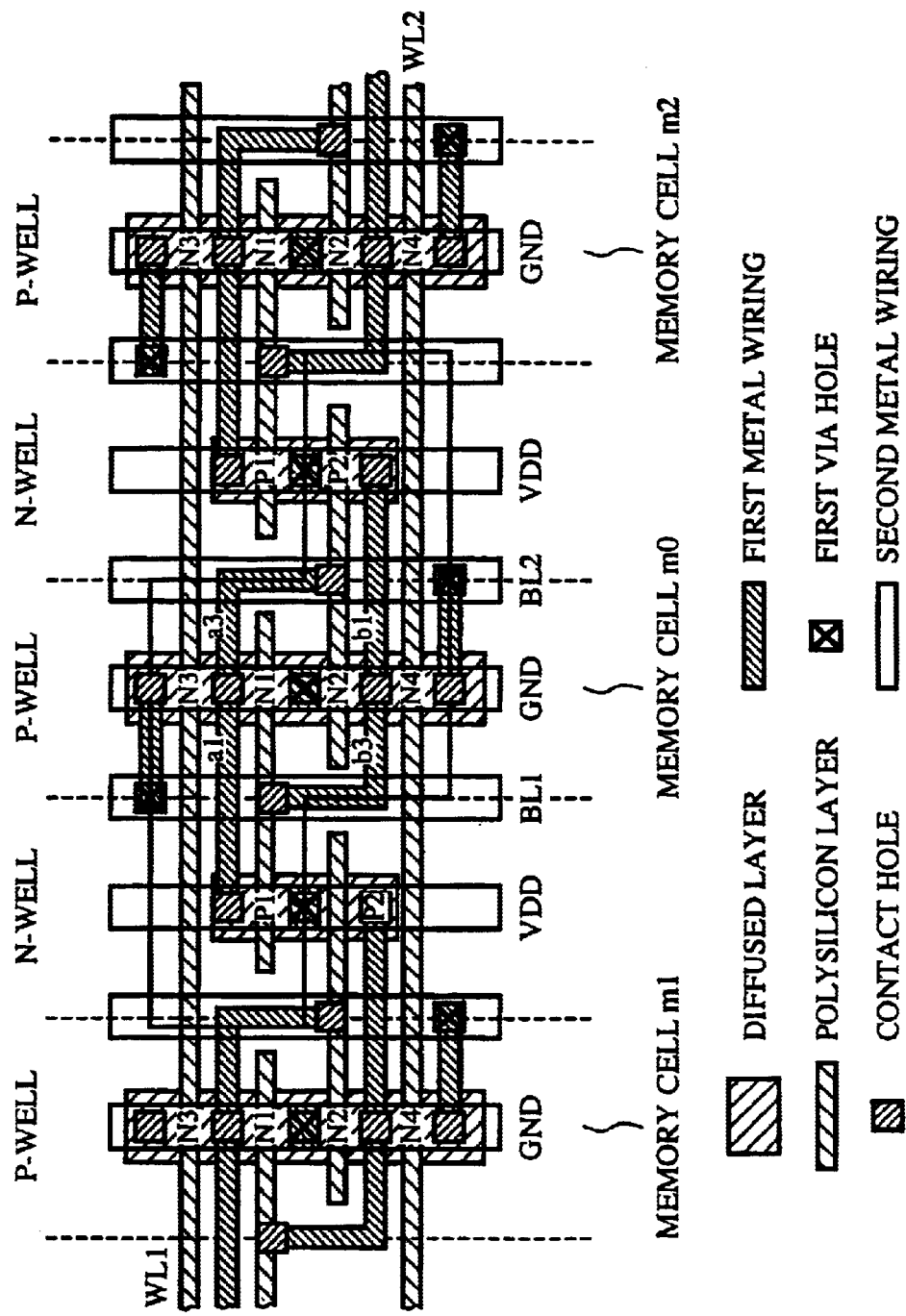
FIG. 7 is a layout configuration diagram showing a semiconductor memory device according to a fourth embodiment of the present invention.
Figure 8:
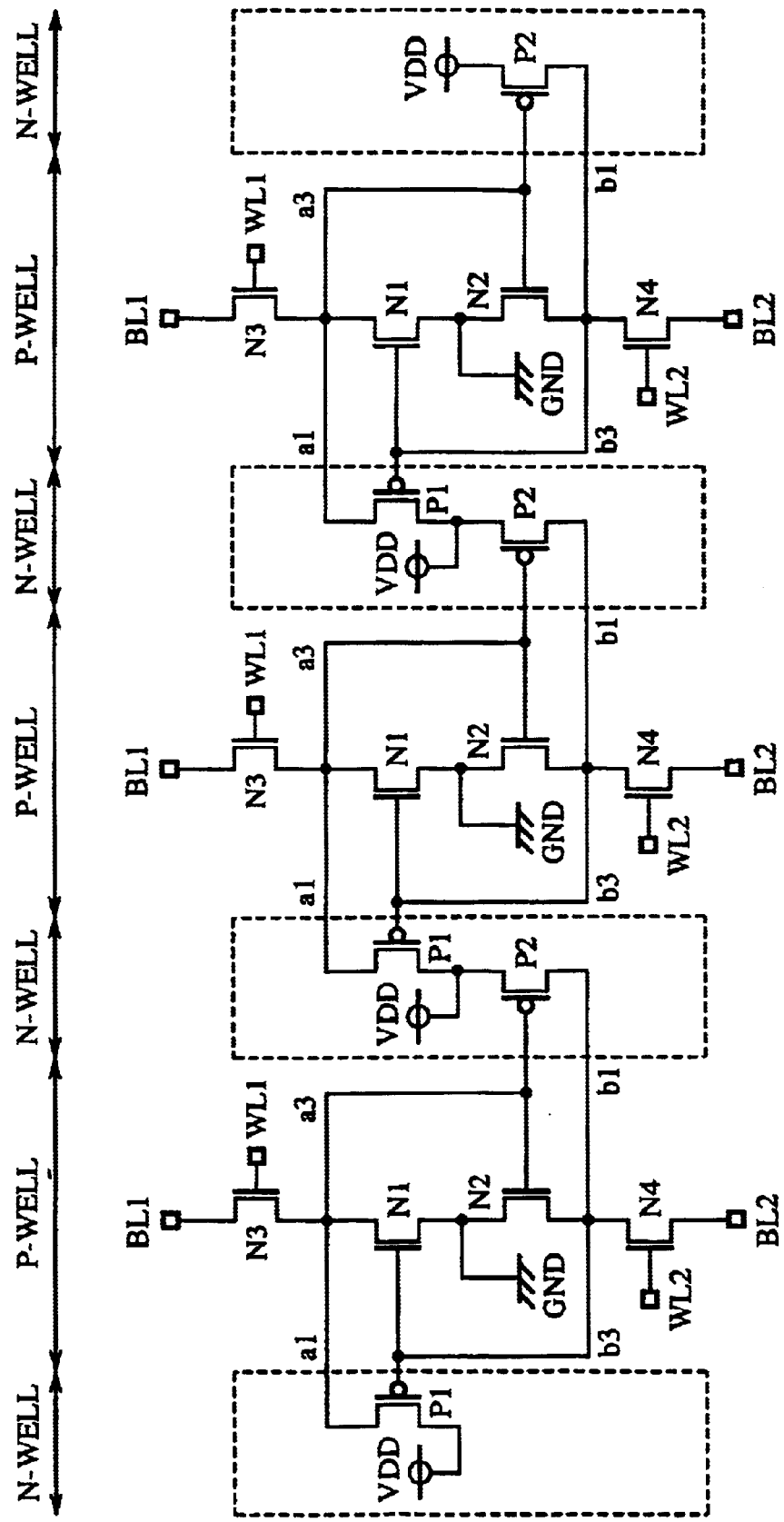
FIG. 8 is a circuit diagram showing the semiconductor memory device shown in FIG. 7.
Figure 9:
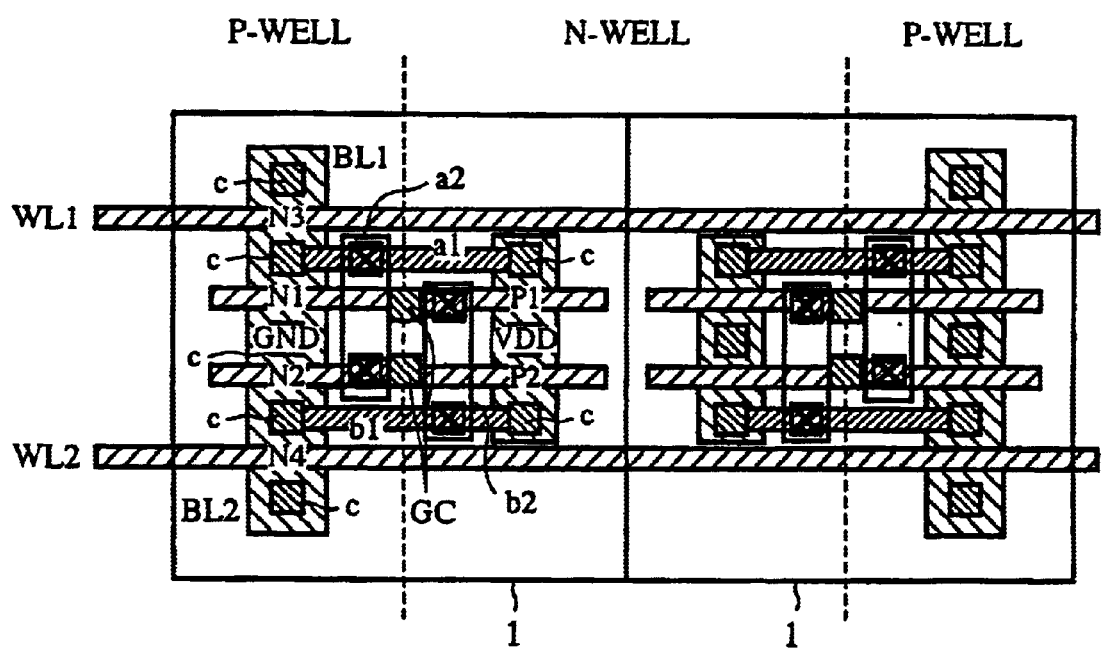
FIG. 9 is a layout configuration diagram showing a conventional semiconductor memory device.

While in the third embodiment the semiconductor memory device made up of one-bit SRAM is shown, in the case where the semiconductor memory device is a plural-bits SRAM, the semiconductor memory device should be formed into the layout configuration such as shown in FIG. 7. FIG. 8 is a circuit diagram showing the semiconductor memory device shown in FIG. 7.

In the fourth embodiment, the source of PMOS transistor P2 of the memory cell m1 is connected to the P+ diffused region to which the source of PMOS transistor P1 of the memory cell m0 is connected to share the P+ diffused region.

Similarly, the source of the PMOS transistor P1 of the memory cell m2 is connected to the P+ diffused region to which the source of the PMOS transistor P2 of memory cell m0 is connected to share the P+ diffused region.

When such a layout configuration is taken, a plurality of memory cells can be fitted together like jigsaws. This removes a wasted region and reduces the region of the semiconductor device.

The bit lines BL1 and BL2 connected with the drains of the NMOS transistors N3 and N4 in each of memory cells are wired such that a power line or a ground line is placed between the bit lines, without adjoining to each other on the second layer as shown in FIG. 7.

This shields the bit lines by the VDD potential or the GND potential, and therefore suppresses interference between the bit lines caused by cross talk and the like.

What is claimed is:

1. A semiconductor memory device, comprising:
    a first inverter consisting of a first PMOS transistor and a first NMOS transistor;
    a second inverter consisting of a second PMOS transistor and a second NMOS transistor, an input terminal thereof being connected with an output terminal of the first inverter and an output terminal thereof being connected with an input terminal of the first inverter;
    a third NMOS transistor connected with the output terminal of the first inverter; and
    a fourth NMOS transistor connected with the output terminal of the second inverter,
    wherein first and second P well regions are formed on opposite adjacent sides of an N well region, the first PMOS transistor and the second PMOS transistor are formed in the N well region in which a P+ diffused region is formed by injecting a P-type impurity, the first NMOS transistor and the third NMOS transistor are formed in the first P well region, and the second NMOS transistor and the fourth NMOS transistor are formed in the second P well region, and wherein a first word line is wired to the third NMOS transistor, and a second word line is wired to the fourth NMOS transistor and wherein a first wiring connecting the output terminal of the first inverter with the input terminal of the second inverter, and a second wiring connecting the input terminal of the first inverter with the output terminal of the second inverter are wired in the same wiring layer, and the first word line and the second word line are placed in the same direction.

2. The semiconductor memory device according to claim 1, wherein the first PMOS transistor and the second PMOS transistor are formed such that a source and a drain align in a direction orthogonal to the first word line and the second word line.

3. The semiconductor memory device according to claim 1, wherein the source of the first PMOS transistor and the second PMOS transistor is connected with the power supply potential of a P+ diffused region formed in the N well region.

4. The semiconductor memory device according to claim 1, wherein the first NMOS transistor and the third NMOS transistor are formed such that the sources and the drains of these transistors align in a direction orthogonal to the first word line.

5. The semiconductor memory device according to claim 1, wherein the second NMOS transistor and the fourth NMOS transistor are formed such that the sources and the drains of these transistors align in a direction orthogonal to the second word line.

6. The semiconductor memory device according to claim 1, wherein the first P well region and the second P well region constitute a memory cell, and the second P well region and another P well region constitute another memory cell.

7. The semiconductor memory device according to claim 6, wherein the source of the first NMOS transistor constituting a memory cell and that of the second NMOS transistor constituting another memory cell are connected with the ground potential of a N+ diffused region formed in a P well region.

8. The semiconductor memory device according to claim 1, wherein the first P well region, the second P well region, and the N well region are formed in a direction orthogonal to the first word line and the second word line in a strip-of-paper shape.

9. The semiconductor memory device according to claim 1, wherein a power line or a ground line is wired between a bit line connected with the third NMOS transistor and that connected with the fourth NMOS transistor.

10. A semiconductor memory device, comprising:
a first inverter consisting of a first NMOS transistor and a first PMOS transistor;
a second inverter consisting of a second NMOS transistor and a second PMOS transistor, an input terminal thereof being connected with the output terminal of the first inverter, and an output terminal thereof being connected with an input terminal of the first inverter;
a third NMOS transistor connected with the output terminal of the first inverter; and
a fourth NMOS transistor connected with the output terminal of the second inverter,
wherein first and second N well regions are formed on opposite adjacent sides of a P well region, the first to the fourth NMOS transistors are formed in the P well region in which a successive N+ diffused region is formed by injecting an N-type impurity, the first PMOS transistor is formed in the first N well region, and the second PMOS transistor is formed in the second N well region, and wherein a first word line is wired to the third NMOS transistor and a second word line is wired to the fourth NMOS transistor and wherein a first wiring connecting the output terminal of the first inverter with the input terminal of the second inverter, and a second wiring connecting the input terminal of the first inverter with the output terminal of the second inverter are wired in the same wiring layer, and the first word line and the second word line are placed in the same direction.

11. The semiconductor memory device according to claim 10, wherein the first to the fourth NMOS transistors are formed such that the sources and the drains of these transistors align in a direction orthogonal to the first word line and the second word line.

12. The semiconductor memory device according to claim 10, wherein the sources of the first NMOS transistor and the second NMOS transistor are connected with the ground potential of a N+ diffused region formed in the P well region.

13. The semiconductor memory device according to claim 10, wherein the first N well region and the second N well region constitute a memory cell, and the second N well region and another N well region constitute another memory cell.

14. The semiconductor memory device according to claim 13, wherein the source of the first PMOS transistor constituting a memory cell and that of the second PMOS transistor constituting another memory cell are connected with the power supply potential of a P+ diffused region formed in the N well region.

15. The semiconductor memory device according to claim 10, wherein the first N well region, the second N well region, and the P well region are formed in a direction orthogonal to the first word line and the second word line in a strip-of-paper shape.

16. The semiconductor memory device according to claim 10, wherein a power line or a ground line is wired between a bit line connected with the third NMOS transistor and that connected with the fourth NMOS transistor.

* * * * *